United States Patent [19]

Munakata et al.

[11] Patent Number: 4,563,642

[45] Date of Patent: Jan. 7, 1986

[54] APPARATUS FOR NONDESTRUCTIVELY MEASURING CHARACTERISTICS OF A SEMICONDUCTOR WAFER WITH A JUNCTION

[75] Inventors: Chusuke Munakata, Nishitama; Noriaki Honma, Hachioji, both of Japan

[73] Assignee: Hitachi, Ltd., Tokyo, Japan

[21] Appl. No.: 432,805

[22] Filed: Oct. 5, 1982

[30] Foreign Application Priority Data

Oct. 9, 1981 [JP] Japan .......................... 56-149490[U]
May 26, 1982 [JP] Japan ................................. 57-87944

[51] Int. Cl.[4] .......................................... G01R 31/26
[52] U.S. Cl. ............................. 324/158 D; 324/158 R
[58] Field of Search ........... 324/158 D, 158 R, 158 T, 324/77 B, 77 C, 77 CS, 60 R

[56] References Cited

U.S. PATENT DOCUMENTS 4,286,215  8/1981  Miller ............................... 324/158 R
4,333,051  6/1982  Goodman ....................... 324/158 R

OTHER PUBLICATIONS

Kamienecki, "Determination of Surface Space Charge Capacitance Using a Light Probe", J. Vac. Sci. Technol., 20(3), Mar. 1982, pp. 811-814.
Japanese Journal of Applied Physics, Munakata, C., et al., "Non-Destructive Method of Observing . . . p-n Junctions . . . ", vol. 20, No. 2, Feb. 1981, pp. L137-L140.
Ogata, K., "Modern Control Engineering", 1970, p. 381.
Ryvkin, S., "Photoelectric Effects in Semiconductors", 1964, pp. 35-45.
Sze, S., "Physics of Semiconductor Devices", 1969, p. 108.
Nakhmanson, R., "Frequency Dependence of the Photo-EMF of Strongly Inverted Ge and Si MIS Structures"-I. Theory, Solid-State Electronics, vol. 18, 1975, pp. 617-626.

*Primary Examiner*—Jerry W. Myracle
*Assistant Examiner*—Stephen M. Baker
*Attorney, Agent, or Firm*—Antonelli, Terry & Wands

[57] ABSTRACT

To nondestructively measure the carrier lifetime and cutoff frequency of a semiconductor wafer having a junction, the apparatus of this invention comprises means for radiating a pulsated photo beam whose frequency is changeable to the semiconductor wafer having a junction, means for taking out the resulting photovoltage by capacitance coupling and means for calculating the carrier lifetime and cutoff frequency from the chopping-frequency dependence characteristics of this photovoltage.

6 Claims, 8 Drawing Figures

APPARATUS FOR NONDESTRUCTIVELY MEASURING CHARACTERISTICS OF A SEMICONDUCTOR WAFER WITH A JUNCTION

BACKGROUND OF THE INVENTION

This invention relates to an apparatus for nondestructively measuring various characteristics of a semiconductor wafer with a junction such as the lifetime of a carrier, the cut-off frequency of the junction and the like by use of a photovoltaic effect.

First, measurement of the carrier lifetime will be described.

Recently, planar type solid state circuit devices have become predominant among solid state circuit devices in general and more definitely, these devices are formed on an a thick semiconductor wafer which is typically about 400μ thick. Needless to say, since the solid circuit devices make use of the transport phenomenon of the current carrier (hereinafter referred to as the "carrier") inside the semiconductor, the lifetime of the carrier inside the wafer exerts significant influences upon the characteristics of the device in the solid state device manufacturing.

To improve the yield of a large number of devices cut out from a single wafer, it is an essential condition that the carrier lifetime inside the wafer be uniform irrespective of the relative position of the wafer positions from which the device is taken.

In solar cells, on the other hand, there is a requirement that the carrier lifetime be long over a wide area so as to improve the conversion efficiency of the solar energy.

It is therefore of the utmost importance to measure and evaluate in advance the carrier lifetime inside the wafer as the substrate not only for solid state circuit devices but also for solar cells.

To the object described above, an apparatus has been commercially available which excites the carrier inside the semiconductor wafer and measures the decay of the carrier by use of microwaves. The apparatus has been effectively used as a lifetime measurement equipment of the wafers before a junction or junctions are formed.

However, in order to operate the solid state device as an active device, whether the solid state device may be the solid state circuit device or the solar cell, a junction exemplified by a p-n junction must be formed on the wafer and hence, the solid state device is mostly subjected to the thermal process of a temperature of about 800° C. to about 1,000° C., including the ion implantation process and its subsequent annealing process. As is well known, after the wafer is subjected to the thermal process, the carrier lifetime drops more than before the thermal process because oxygen and other trace impurities contained in the wafer precipitate and diffuse.

Accordingly, the carrier lifetime measured for the bulk wafer does not eventually represent the finished solid state device. It is therefore necessary to measure and evaluate by all means the carrier lifetime after the junction is formed. Quite naturally, however, the conventional measuring method of the carrier lifetime by photo-excitation microwave measurement can not be used any longer. The reason for this is that the resulting junction-forming layer masks the microwave response and hence, detection is no longer possible using the microwave technique.

Accordingly, several methods have been proposed in the past to measure the carrier lifetime of the wafer substrate after the junction is formed. Among these methods, the photocurrent method which is most analogous to the present invention will be described.

FIG. 1A shows the principle of the photocurrent method. The drawing shows the case of a p-n junction formed by a p-type Si substrate (wafer) 1 and an n-type layer 2 disposed on the substrate, by way of example. When the photo beam 3 is radiated to this junction, a photocurrent develops through the junction as is well known in the art. The photocurrent excited by the photo beam 3 can be taken out from the junction by disposing metallic electrodes 4 and 4' on the wafer substrate 1 and on the n-type layer 2, respectively. The current can be accurately read by a meter 6 after it is amplified by an amplifier 5.

If the photo beam is pulsated and the chopping frequency is changed so as to read the photocurrent, the photocurrent $I_{ph}$ changes, as illustrated in FIG. 1B. For an angular frequency $\omega = 2\pi \times$ (pulse frequency), the photocurrent $I_{ph}$ remains substantially constant so long as the angular frequency $\omega$ is small. But when the angular frequency $\omega$ exceeds $\omega_0$, for example, the photocurrent decreases in proportion to $\omega^{-\frac{1}{2}}$. The bending point of this photocurrent $I_{ph}$ can be diagrammatically obtained simply.

If the assumption that almost all the photocurrent occurs on the substrate 1 is established, the relation between $\omega_0$ and the carrier lifetime $\tau$ can be easily expressed by the following formula:

$$\omega_0 \tau = 1 \tag{1}$$

If $\omega_0$ is obtained from FIG. 1B, the carrier lifetime $\tau$ can be easily obtained by calculation from the formula (1).

If the junction has in advance the metallic electrodes 4 and 4' as in the case of the solar cell, the photocurrent method is extremely convenient.

However, even the solar cell does not have the metallic electrodes immediately after the junction is formed and the conventional photocurrent method can not be employed in such a case. In the case of the solid circuit device process, the junction is formed at the initial stage of the process and the electrodes can not be formed at the junction in order to prevent contamination that occurs in the subsequent several steps. Accordingly, if the conventional photocurrent method is used as such, it means discard of the subsequent steps (that is, to discard the products as the defective products). In this sense, the photocurrent method becomes a kind of destructive inspection method.

Besides the p-n junction, other types of junctions include a Schottky barrier junction between the metal and Si and a $p^+$-p type junction or a so-called high-low junction. In either case, the inspection becomes descructive inspection if the measuring metallic electrodes are formed.

Still another kind of junction is a so-called "Field Induced Junction" exemplified by $SiO_2$-p type Si. In this junction, the photocurrent generated at the junction can not be detected even if the metallic electrodes can be formed on the $SiO_2$ film, unless the $SiO_2$ film is as thin as about 50 Å. This is the case since $SiO_2$ is an insulation material and does not generally allow the passage of a current. The conventional photocurrent method can not be applied completely to this kind of junction. As is well known from an FET transistor, however, the field induced junction has gained an extremely wide application nowadays in the same way as the p-n junction. Hence, any measuring method of semiconductor characteristics is fatal unless the method can also be applied to the field induced junction.

Next, measurement of the cut-off frequency will be described.

As is well known, a resistance component ($R_j$) and a capacitance component ($C_j$) exist in parallel with each other in the p-n junction of the semiconductor described above. When a predetermined a.c. current i is applied to this p-n junction, the terminal voltage v of the p-n junction decays in inverse proportion to the frequency f above a predetermined frequency $f_c$. This can be numerically expressed by the following formula (2):

$$v = i \cdot \frac{R_j}{\sqrt{1 + (2\pi f R_j C_j)^2}} \quad (2)$$

The frequency f at which the terminal voltage v of the p-n junction starts decaying is defined as the cut-off frequency $f_c$ and is used as a numeric value representative of the characteristics of the p-n junction. This frequency is given by the following equation (3):

$$f_c = \frac{1}{2\pi R_j C_j} \quad (3)$$

It has been a customary practice to measure the characteristics by applying the current i from outside, using the electrodes formed on the finished p-n junction in accordance with the method described above.

However, the solid state device industry now requires to know the cut-off frequency of the p-n junction before the the electrodes are formed on the p-n junction. This is quite natural because the quality of the solid state devices must be determined at a stage as early as possible in order to improve the yield.

In the semiconductor device manufacturing process, the metallic electrodes for measurement or the like must not be brought into contact with the portion of the solid state device portion such as the p-n junction from the aspect of prevention of breakdown, contamination and the like, as described already. Hence, this requirement can not be satisfied unless the method is a nondestructive method.

SUMMARY OF THE INVENTION

It is therefore an object of the present invention to provide an apparatus which can non-destructively measure the carrier lifetime and the cut-off frequency of the junction by use of the junction itself without deliberately forming the measuring metallic electrodes on the junction.

To accomplish this object, the apparatus in accordance with the present invention is characterized in that a photo beam which has a variable frequency and is pulsated is radiated to a semiconductor wafer having a junction, the resulting photovoltage is picked up by capacitance coupling and the carrier lifetime and the cut-off frequency are determined from the chopping frequency dependence of this photovoltage using a signal processing circuit.

According to the characterizing construction of the apparatus of the present invention described above, it is now possible to nondestructively measure the carrier lifetime and cut-off frequency of the semiconductor wafer during the solid state device manufacturing process after the formation of the junction, that is, without forming the measuring electrodes in particular.

The apparatus of the present invention makes it also possible to easily measure the carrier lifetime of the semiconductor wafer having a field induced junction, the measurement of which has not been possible absolutely in accordance with the conventional photocurrent method.

DESCRIPTION OF THE PREFERRED EMBODIMENTS

First, the principle of the present invention will be described with reference to the p-n junction by way of example.

Figure 2A:
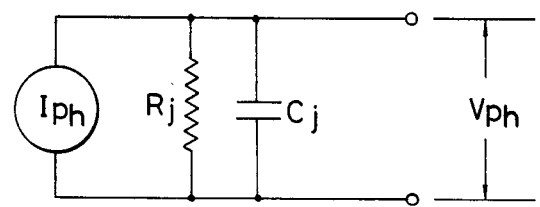
FIGS. 2A and 2B illustrate the principle of the measurement of the carrier lifetime and the cut-off frequency in accordance with the photo-voltaic method of the present invention.

As described already, two factors, i.e., junction capacitance $C_j$ and junction resistance $R_j$, are defined for the p-n junction and they are believed to be connected in parallel to form the junction. When the junction is excited by the photo beam, the photocurrent $I_{ph}$ occurs, as described already. This photocurrent $I_{ph}$ flows through the junction capacitance $C_j$ and the junction resistance $R_j$ as shown in FIG. 2A unless an external circuit is disposed. As a result, a voltage takes place across both ends of the junction and this voltage becomes a photovoltage $V_{ph}$.

Accordingly, the photovoltage $V_{ph}$ is given by the following formula:

$$V_{ph} = \frac{R_j}{1 + j\omega C_j R_j} \cdot I_{ph} \quad (4)$$

where $j=\sqrt{-1}$ represents the imaginary number portion. In the formula (4), if the junction capacitance $C_j$ and the junction resistance $R_j$ do not depend upon the angular frequency $\omega$ of the pulse-like photo beam but are constant, and if the photocurrent $I_{ph}$ does not depend upon the angular frequency $\omega$, either, the amplitude change of the photovoltage $V_{ph}$ remains constant within a small range of $\omega$ and when it exceeds $\omega_c$, it decreases in proportion to $\omega^{-1}$. As can be easily determined from the formula (4), the following formula can be obviously given:

$$\omega_c R_j C_j = 1 \quad (5)$$

The frequency that gives this angular frequency $\omega_c$ is the cutoff frequency of the p-n junction. In other words, the cutoff frequency $f_c$ of the semiconductor wafer can be obtained on the basis of the relation $f_c = \omega_c/2\pi$.

Figure 1A:
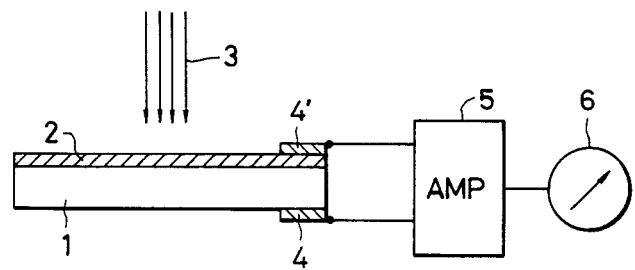
FIGS. 1A and 1B illustrate the principle of the measurement of the carrier lifetime in accordance with the heretofore known photocurrent method.
Figure 1B:
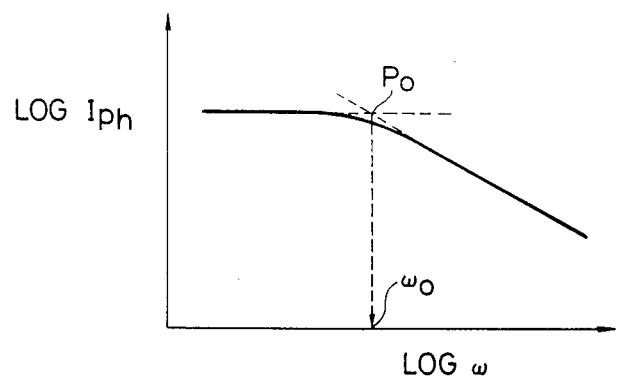
Figure 2B:
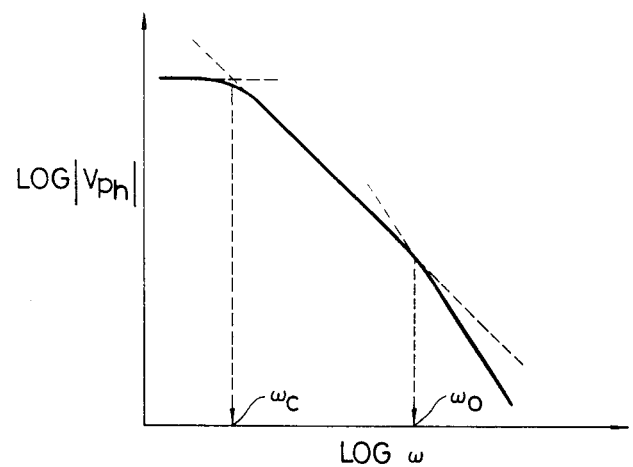

However, as explained already with reference to the photocurrent method, $I_{ph}$ changes dependently with $\omega^{-\frac{1}{2}}$ when it exceeds $\omega_0$ as shown in FIG. 1B so that the amplitude change of $V_{ph}$ starts decreasing in proportion to $\omega^{-3/2}$ above $\omega_0$, as shown in FIG. 2B. The carrier lifetime $\tau$ can be determined from this $\omega_0$ value on the basis of the relation $\tau = 1/\omega_0$, as described already.

$I_{ph}$ decreases in proportion to $\omega^{-\frac{1}{2}}$ as shown in FIG. 1B because the carrier lifetime $\tau(\omega)$ excited by the pulse light has apparently the following frequency dependence and this is a well known fact:

$$\tau(\omega) = \frac{\tau}{1 + j\omega\tau} \qquad (6)$$

The present invention assumes that $C_j$ and $R_j$ are not dependent upon $\omega$, but are instead constant. But this assumption is not always satisfied. As can be understood from FIG. 2B, $V_{ph}$ depends upon $\omega$ and both $C_j$ and $R_j$ change while depending upon $V_{ph}$. In other words, when $V_{ph}$ exceeds the equivalent voltage of the thermal energy (about 25 mV at room temperature), $R_j$ remarkably changes while depending upon $V_{ph}$ and $C_j$ also changes to some extents. On the contrary, if $V_{ph}$ is sufficiently smaller than the equivalent voltage of the thermal energy, thermal equilibrium is maintained and $R_j$ and $C_j$ in this case are not dependent upon $V_{ph}$ and hence upon $\omega$, but are constant. In this case, an ideal curve shown in FIG. 2B can be obtained.

Though the foregoing deals with the p-n junction as a typical case, it is frequently observed in the SiO$_2$-p type wafer or the like that $V_{ph}$ is not accurately proportional to $\omega^{-1}$ even if it exceeds $\omega_c$ because of the time constant of the surface state. In other words, $V_{ph}$ is constant within a small range of $\omega$, decreases proportionally to $\omega^{-a}$ (a is about 0.2 to about 1.5) when it exceeds $\omega_c$, and decreases proportionally to $\omega^{-(a+\frac{1}{2})}$ when it further exceeds $\omega_0$. In such a case, too, $\omega_c$ can be measured as an angular frequency which starts decreasing at $\omega^{-a}$ from the range of the angular frequency in which $V_{ph}$ remains constant. $\omega_0$ can also be measured as a value when the frequency dependence of $V_{ph}$ changes from $\omega^{-a}$ to $\omega^{-(a+\frac{1}{2})}$.

As described above, the present invention detects the photovoltage $V_{ph}$ in place of the photocurrent $I_{ph}$. Unlike current detection, detection of voltage is generally possible by capacitance coupling and this capacitance coupling is the important basis of the present invention.

Figure 3A:
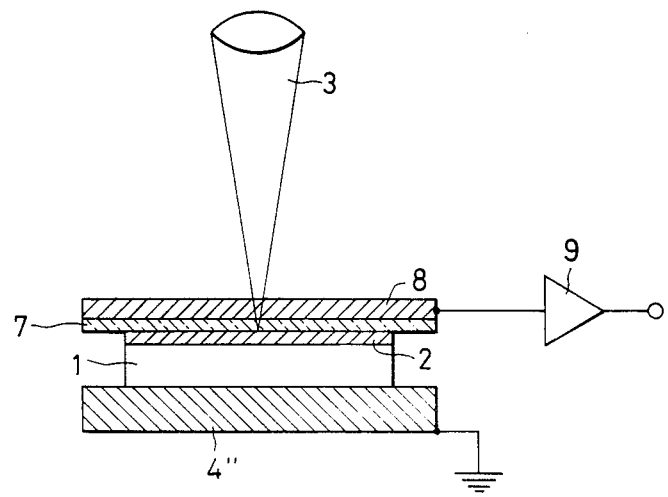
FIGS. 3A and 3B illustrate the principle of the construction of the apparatus for measuring the carrier lifetime and the cut-off frequency in accordance with the present invention.

FIG. 3A diagrammatically shows the principle of the construction of the apparatus in accordance with the present invention. Generally, the reverse side of the wafer 1 may be brought into contact with a metal; hence, the wafer 1 having the junction is placed on a metallic electrode 4" which serves also as a sample stage. A spacer 7 consisting of an about 10 to 100 μm thick transparent insulation is placed on the n-type layer 2 of the wafer 1. Ideally, it is an air layer (or a vacuum layer) but the material of the spacer may be arbitrary so long as it does not break or contaminate the surface of the junction and is transparent to the photo beam that is radiated. A transparent electrode 8 is placed on the spacer 7. When the photo beam 3 is radiated to the junction, a photovoltage is generated across the front and reverse side of the junction and is picked up by the electrode 4" (ground) and the electrode 8. The voltage thus produced is generally below 1 mV and is therefore amplified by a lock-in amplifier 9 for measurement.

Figure 3B:
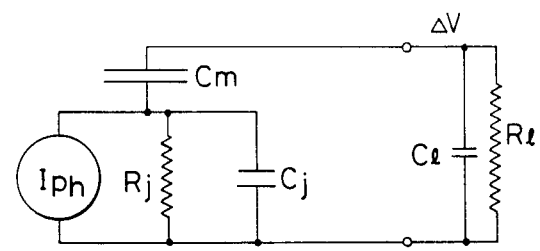

FIG. 3B shows the equivalent circuit diagram of this detection method. In the drawing, $C_m$ represents the capacitance of the spacer 7 which is a few nF and Rl and Cl represent the input resistance (about 100 MΩ) and input capacitance (about 30 pF) of the lock-in amplifier 9. The following formula is obtained with $\Delta V$ representing the voltage that is observed:

$$\Delta V = V_{ph} \frac{j\omega C_m R_l(1 + j\omega C_j R_j)}{1 - \omega^2(C_m C_l + C_j C_l + C_m C_j)R_j R_l + j\omega\{(C_m + C_j)R_j + (C_l + C_m)R_l\}} \qquad (7)$$

As can be seen from the formula (7), the relation $\Delta V \cong V_{ph}$ can be established over a wide frequency range if Rl is large and Cl is small (that is, the input impedance of the lock-in amplifier 9 is great) so that $V_{ph}$ can be measured by capacitance coupling and hence, the curve shown in FIG. 2B can be obtained. From this curve, $\omega_c$ and $\omega_0$ can be determined so that the cutoff frequency $f_c$ at the photo beam radiation point and the carrier lifetime $\tau$ can be determined from the relation $f_c = \omega_c/2\pi$, $\tau = 1/\omega_0$.

Figure 4:
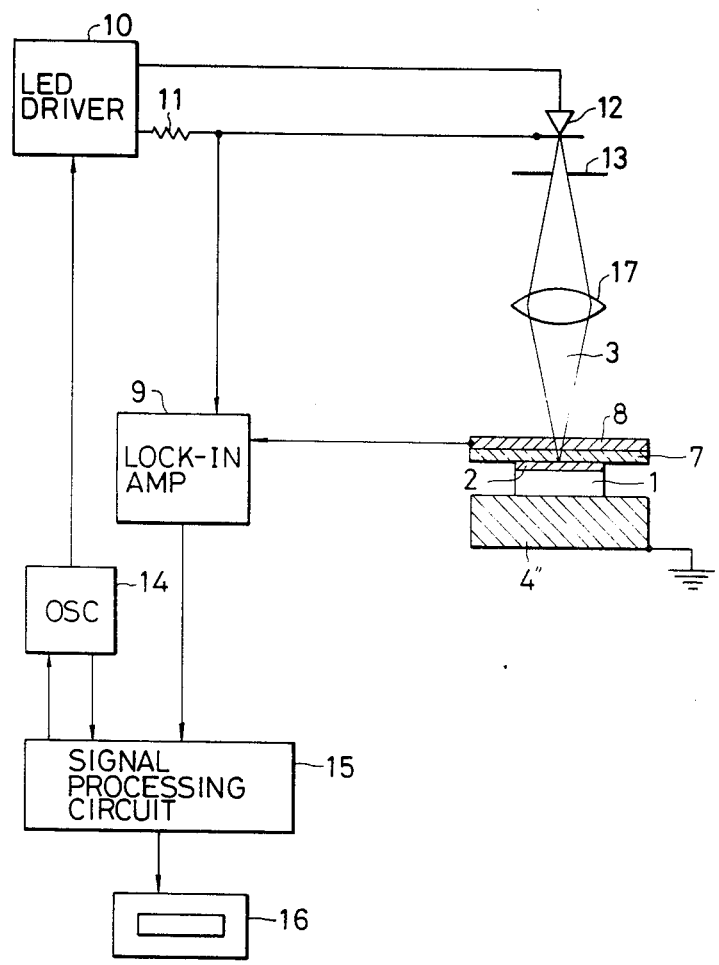
FIG. 4 is a block diagram of the carrier lifetime measuring apparatus in accordance with one embodiment of the present invention.

FIG. 4 shows the overall construction of the apparatus in accordance with one embodiment of the present invention. A gas laser, a semiconductor laser, a lamp or the like may be used as the light source 12 for radiating the photo beam 3, but this embodiment uses a light emitting diode. The light emitting diode is economical, small in size and convenient to use. Upon receiving an a.c. (pulse) current from a driving current source, the light emitting diode 12 emits the pulse light 3. The driving current signal is detected by a detection resistor 11 and is used as a reference signal of the lock-in amplifier 9.

The photovoltage is detected by the transparent electrode 8 and is amplified by the lock-in amplifier 9. The output of this amplifier is applied to a signal processing circuit 15, which gives instruction to change the frequency of the pulse light 3 to an oscillator 14. The signal processing circuit 15 also monitors the oscillation frequency of the oscillator 14. The output of the oscillator 14 is applied to the light emitting diode driving circuit 10, where it is converted to a current pulse of a predetermined frequency and is applied to the light emitting diode 12.

The diverging angle of the emitted photo beam from the light emitting diode 12 is restricted by an aperture 13 and is converged by a lens 17. The photo beam is then radiated to the p-n junction.

From the data of the frequency and the photovoltage thus applied thereto, the signal processing circuit 15 evaluates the change mode in accordance with a predetermined sequence set in advance, determines $\omega_c$ and $\omega_0$, calculates the cutoff frequency $f_c = \omega_c/2\pi$ and the carrier lifetime $\tau = 1/\omega_0$ and digitally displays the result.

Figure 5:
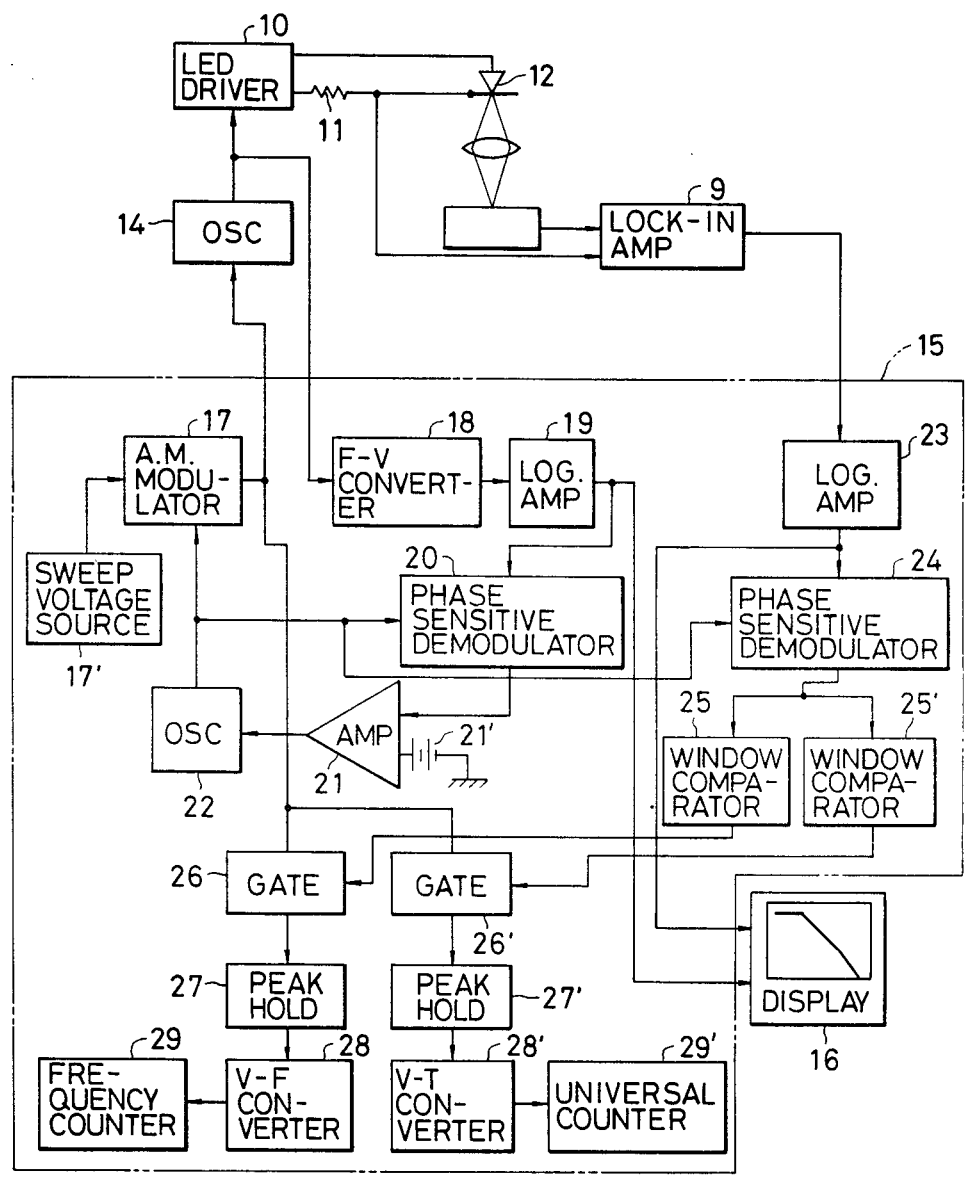
FIG. 5 is a block diagram showing in detail the construction of the signal processing circuit 15 shown in FIG. 4.

FIG. 5 shows in detail the construction of the signal processing circuit 15 shown in FIG. 4. In the drawing, the output voltage of a frequency-sweep voltage source 17' is applied to a modulator whose output is changeable by an external signal, and is shallowly modulated. The output voltage of an amplitude modulator 17' is applied to the oscillator 14 consisting of a voltage-frequency converter. The output of the oscillator 14 is applied to the driving current source 10, which causes the light-emitting diode 12 to emit the light. The output of the oscillator 14 is changed to a voltage proportional to the frequency by the frequency-voltage convertor 18 and is then changed to a logarithm by a logarithmic amplifier 19. Accordingly, the output voltage of the logarithmic amplifier 19 becomes a signal proportional to log f with f representing the oscillation frequency of the oscillator 14. The output voltage represents the abscissa of the display 16.

On the other hand, the photovoltage $V_{ph}$ generated on the semiconductor wafer is detected by the lock-in amplifier 9 which operates as a phase-sensitive demodulator using a voltage across both ends of a resistor 11 for driving current monitor of the light-emitting diode 12 as the reference signal. The output voltage of the phase-sensitive demodulator 9 is applied to the logarithmic amplifier 23 and is picked up as a voltage output proportional to log $V_{ph}$. The output of the logarithmic amplifier 23 is applied to the ordinate of the display 16 and is displayed. Accordingly, the display 16 displays the frequency characteristics of the photovoltage with the abscissa and ordinate representing log f and log $V_{ph}$, respectively.

On the other hand, the output voltage of the amplitude modulator 17 is shallowly modulated by a sinusoidal wave oscillator whose output amplitude is controllable so that the oscillation frequency of the oscillator 14 changes by $\pm \Delta f/2$ in response to the modulation. Next, the differential components of the output of the logarithmic amplifier 19 and the output of the logarithmic amplifier 23 along with this modulation are detected by the phase-sensitive demodulators 20 and 24, respectively. The output of the phase-sensitive demodulator 20 becomes a d.c. voltage proportional to $\Delta(\log f)$ and is compared with a reference voltage 21' by a differential amplifier 21. The error signal as the output of this differential amplifier is used for controlling the output amplitude of the oscillator 22 to form a feedback system so that the output of the phase-sensitive demodulator 20 becomes constant. In other words, the differential component $\Delta(\log f)$ of log f becomes constant. Accordingly, the output of the phase-sensitive demodulator 24 becomes a signal proportional to the value obtained by differentiating log $V_{ph}$ by log f. That is, when the frequency is swept in the increasing direction, the frequency characteristics of the photovoltage provides the 0 signal at a low frequency, is proportional to 1 when exceeding the cutoff frequency and becomes a signal proportional to 3/2 after passing the bending point by the carrier lifetime. Then, window comparators 25 and 25' detect the change from 0 to 1 and the change from 1 to 3/2 and produce pulses, respectively. The input voltage to the oscillator 14 when these changes occur is detected by gate circuits 26 and 26' and its peak value is held by peak value hold circuits 27 and 27'. Next, the voltage held by the peak value hold circuit 27 actuates the voltage-frequency convertor 28 to change the voltage to the frequency, which frequency is read by a frequency counter 29. On the other hand, the voltage held by the peak value hold circuit 27' controls the voltage-frequency period convertor 28' so that the frequency period becomes $\frac{1}{2}\pi f$ and this period is read by a universal counter 29'. Accordingly, the frequency of the photovoltage when the output of the phase-sensitive demodulator 24 changes from 0 to 1 is read by the counter 29 and the value $\frac{1}{2}\pi$ times the frequency when the output changes from 1 to 3/2 is read by the universal counter 29'. The frequency displayed by the frequency counter 29 provides the cutoff frequency $f_c$ of the junction and the time displayed by the universal counter 29' provides the carrier lifetime $\tau$.

Though the embodiment described above deals with the semiconductor wafer having the p-n junction by way of example, the cutoff frequency and carrier lifetime of the semiconductor wafer having a Schottoky junction, a p+-p type junction, an n+-n type junction or a field induced junction can also be measured naturally in the same way.

If $V_{ph}$ decrease proportionally to $\omega^{-a}$ (a is about 0.2 to 1.5) after exceeding $\omega_c$ as described already, it is necessary to change the set voltage of the window comparators 25 and 25'. In other words, $f_c$ and $\tau$ can be measured in the same way as described above by controlling the comparators so that the window comparator 25 produces a pulse voltage when the output voltage from the logarithmic amplifier 23 changes from 0 to a voltage proportional to a and the window comparator 25' produces a pulse voltage when the output voltage changes to a voltage proportional to a.

As is obvious from the foregoing description, the present invention can nondestructively measure the carrier lifetime without particularly forming the measuring metallic electrodes on the junction and hence, it can check the carrier lifetime of the semiconductor wafers at any step in the solid state circuit manufacturing process and can remarkably improve the yield of the products. Since the present invention does not call for a complicated and expensive apparatus as the conventional apparatuses using the microwave, the present invention can be produced and used easily and provides remarkable practical effects.

In accordance with the present invention, it is also possible to measure non-contactively and nondestructively the cutoff frequency determined by the constants inside the junction by use of a simple construction without taking out the electrodes from the junction. Accordingly, the quality of the junction can be checked at the early stage of the production of LSIs or the like and defect of the process or the wafer material itself can be detected at the early stage. Hence, it is possible to prevent continuance of the wasteful process any more and the present invention provides remarkable effects in the improvement of the yield and in the energy saving.

What is claimed is:

1. An apparatus for nondestructively measuring at least one predetermined characteristic of a semiconductor wafer having a junction, comprising:
   means for generating a photo beam modulated by a modulation signal;
   electrodes disposed so as to oppose each other with a gap into which a semiconductor wafer having a junction can be inserted;
   at least one of said electrodes being transparent to said photo beam and being disposed so as to form capacitance coupling with said semiconductor wafer;
   means for radiating said photo beam to said semiconductor wafer through said transparent electrode;
   means for taking out a photovoltage generated on said semiconductor wafer through both of said electrodes as an electric signal; and
   means for determining a particular angular frequency of said modulation signal providing specific decay of the amplitude of said electric signal and calculating a value for said predetermined characteristic of said semiconductor wafer from said particular angular frequency,
wherein said predetermined characteristic includes at least one of a cut-off frequency and a carrier lifetime of said semiconductor wafer 2. The apparatus as defined in claim 1 wherein said calculation means includes circuit means for determining a particular angular frequency $\omega_c$ when the amplitude of said electric signal changes from a constant range to a range in which it changes substantially proportionally to $\omega^{-1}$ with the change in the angular frequency $\omega$ of said modulation signal and for determining the cutoff frequency $f_c$ of said semiconductor wafer at the photo beam radiation position from the angular frequency $\omega_c$ on the basis of the relational formula $f_c = \omega_c/2\pi$.

3. The apparatus as defined in claim 1 wherein said calculation means includes circuit means for determining a particular angular frequency $\omega_0$ when the amplitude of said electric signal shifts from a range in which it changes substantially proportionally to $\omega^{-1}$ to a range in which it changes substantially proportionally to $\omega^{-3/2}$ along with the change in the angular frequency $\omega$ of said modulation signal and for determining the carrier lifetime $\tau$ of said semiconductor wafer at the photo beam radiation position from this angular frequency $\omega_0$ on the basis of the relational formula $\tau = 1/\omega_0$.

4. The apparatus for nondestructively measuring the characteristics of a semiconductor wafer having a junction, as defined in claim 1 wherein said means for generating the modulated photo beam include a light source, a driving source for driving said light source and an oscillator connected to said driving source so as to modulate the photo beam.

5. The apparatus for nondestructively measuring the characteristics of a semiconductor wafer having a junction, as defined in claim 1 wherein said photo beam radiation means include an aperture for restricting the radiation angle of the photo beam and an optical lens for converging the photo beam passing through said aperture to said semiconductor wafer.

6. The apparatus for nondestructively measuring the characteristics of a semiconductor wafer having a junction, as defined in claim 1 wherein said electric signal take-out means includes a phase-sensitive demodulator using said modulation signal as the reference input signal.

* * * * *